US012727478B2

(12) United States Patent
Park et al.

(10) Patent No.: US 12,727,478 B2
(45) Date of Patent: Sep. 1, 2026

(54) COOLING APPARATUS, SEMICONDUCTOR DEVICE INCLUDING THE APPARATUS, AND MANUFACTURING METHOD THEREOF

(71) Applicant: KOOLMICRO INC., Daejeon (KR)

(72) Inventors: Yeong Lyeol Park, Yongin (KR); Kyo Sung Choo, Busan (KR)

(73) Assignee: KOOLMICRO INC., Daejeon (KR)

( * ) Notice: Subject to any disclaimer, the term of this patent is extended or adjusted under 35 U.S.C. 154(b) by 561 days.

(21) Appl. No.: 18/184,500

(22) Filed: Mar. 15, 2023

(65) Prior Publication Data

US 2023/0298969 A1 Sep. 21, 2023

Related U.S. Application Data

(60) Provisional application No. 63/378,606, filed on Oct. 6, 2022, provisional application No. 63/401,492, filed on Aug. 26, 2022.

(30) Foreign Application Priority Data

Mar. 18, 2022 (KR) ........................ 10-2022-0033979

(51) Int. Cl.
*H10W 40/47* (2026.01)
*H10W 40/00* (2026.01)
*H10W 40/77* (2026.01)

(52) U.S. Cl.
CPC ......... *H10W 40/47* (2026.01); *H10W 40/037* (2026.01); *H10W 40/77* (2026.01)

(58) Field of Classification Search
CPC ... H01L 23/36; H01L 23/367; H01L 23/3672; H01L 23/3675; H01L 23/3677; H01L 23/373; H01L 23/3735; H01L 23/427; H01L 23/433; H01L 23/473; H01L 21/4882; H01L 24/01; H01L 2924/0002; H05K 7/20; H05K 7/20254; H05K 7/20327; H05K 7/20381; H05K 7/2039;
(Continued)

(56) References Cited

U.S. PATENT DOCUMENTS 6,351,384 B1 * 2/2002 Daikoku ................ F28F 13/12 361/689
11,849,569 B2 * 12/2023 Zhou ................. H05K 7/20254
(Continued)

FOREIGN PATENT DOCUMENTS

| CN | 114583517 A * | 6/2022 | ............ H01R 39/26 |
|---|---|---|---|
| JP | 2006-515054 A | 5/2006 | |
| KR | 10-2015-0135347 A | 12/2015 | |

OTHER PUBLICATIONS

CN-114583517-A English Translation (Year: 2022).*
(Continued)

*Primary Examiner* — Amir A Jalali

(57) ABSTRACT

A cooling apparatus may include a microchannel structure including a plurality of microchannels and a manifold disposed over the plurality of microchannels. The microchannel structure may be directly bonded to a chip and dissipate heat generated in the chip during an operation of the chip. The microchannel structure may further include a base over which the plurality of microchannels are disposed and a plurality of fins spaced apart from each other and disposed over the base.

13 Claims, 12 Drawing Sheets

(58) Field of Classification Search

CPC ........... H05K 7/20509; H05K 7/20627; H05K 7/20663; H05K 7/20763; H05K 7/20772; H05K 7/208; H05K 7/20927; H05K 7/30936; F28D 15/00; F28D 15/02; F28F 3/00; F28F 3/12; F28F 2260/02

See application file for complete search history.

(56) References Cited

U.S. PATENT DOCUMENTS

2004/0112585 A1* 6/2004 Goodson ............... F04B 19/006 165/80.4
2004/0206477 A1* 10/2004 Kenny .................... F04B 17/00 257/E23.098
2005/0151244 A1* 7/2005 Chrysler ............... H01L 23/473 257/713
2006/0002087 A1* 1/2006 Bezama ................ H01L 23/473 257/E23.098
2006/0103011 A1* 5/2006 Andry ................. H01L 25/0657 257/E23.098
2010/0012294 A1* 1/2010 Bezama .............. H01L 23/3672 165/80.4
2015/0107801 A1* 4/2015 Campbell ............ H05K 7/2039 165/104.19
2015/0208555 A1* 7/2015 Flotta .................. H01L 23/4735 165/247
2017/0196116 A1* 7/2017 Lyon ..................... H01L 23/473
2017/0292537 A1* 10/2017 Barak ..................... F04D 25/06
2018/0098458 A1* 4/2018 Chainer ............. H05K 7/20254
2018/0098459 A1* 4/2018 Chainer ............. H05K 7/20254
2020/0227341 A1* 7/2020 Neal ......................... F28F 3/12
2021/0112686 A1* 4/2021 Dogruoz ............... H01L 23/427
2021/0180880 A1* 6/2021 Zhou .................. H05K 7/20927
2022/0146214 A1* 5/2022 Mohanta ................. F28F 1/422
2023/0048534 A1* 2/2023 Vafai ................... H01L 25/0657

OTHER PUBLICATIONS

M.M. Ohadi et al., “A Comparison Analysis of Air, Liquid, and Two-Phase Cooling of Data Centers,” 28th IEEE Semi-Therm Symposium, 2012.

* cited by examiner

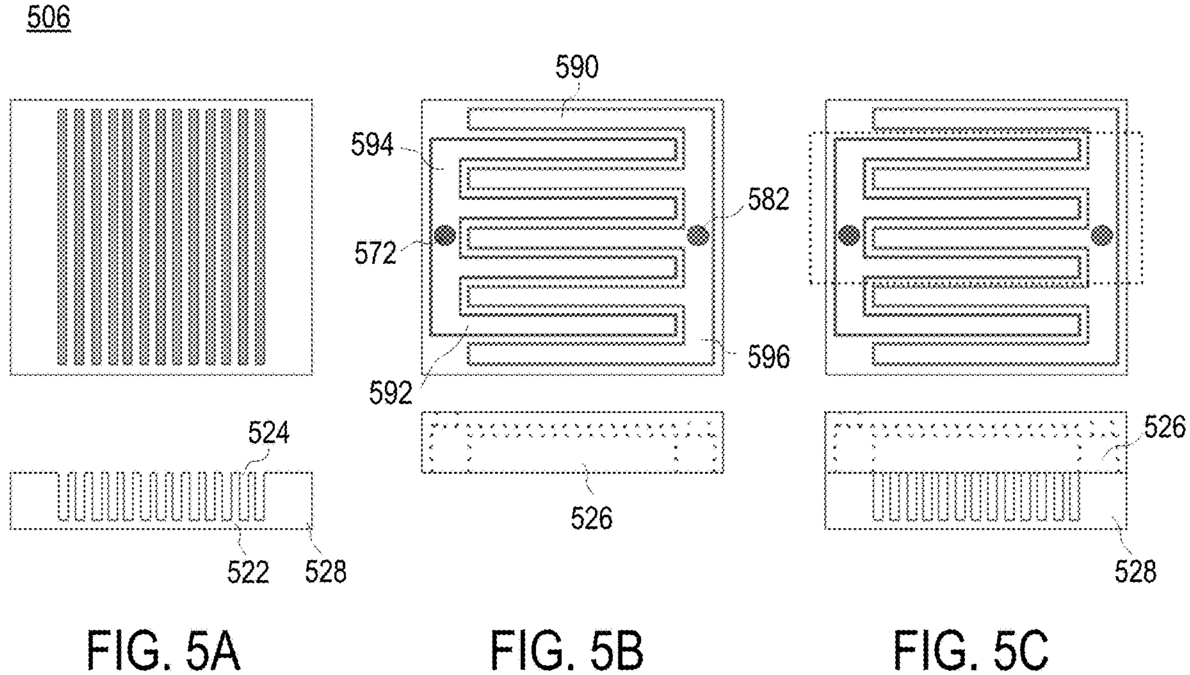
FIG. 5A
FIG. 5B
FIG. 5C
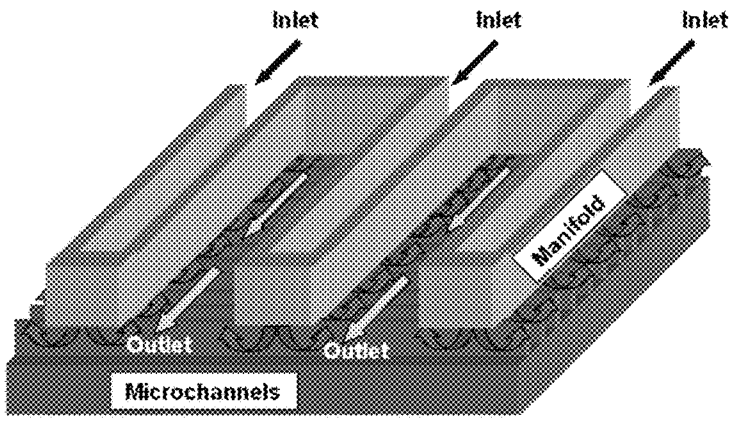
FIG. 5D 824B
828B 824E
828E 824D
828D 824A
828A 824C
828C

COOLING APPARATUS, SEMICONDUCTOR DEVICE INCLUDING THE APPARATUS, AND MANUFACTURING METHOD THEREOF

CROSS-REFERENCE TO RELATED APPLICATIONS

This application claims priority to U.S. Provisional Patent Application Ser. No. 63/378,606, filed on Oct. 6, 2022, to U.S. Provisional Patent Application Ser. No. 63/401,492, filed on Aug. 26, 2022, and to Korean patent application number 10-2022-0033979, filed in the Korean Intellectual Property Office on Mar. 18, 2022, all of which are incorporated by reference herein in its entirety.

BACKGROUND

As more calculations are performed on a chip (e.g., a semiconductor chip used in a computer) and such a chip is fabricated with a relatively high degree of integration, an amount of heat per unit area (Power Intensity) or per unit volume (Power Density) is increasing. As the power density increases, a cooling apparatus as well as a cooling method for the chip have been developed to increase cooling efficiency.

SUMMARY

Embodiments of the present disclosure relate to a cooling apparatus, a semiconductor device including the apparatus, and a cooling method capable of cooling heat generated in the chip. More specifically, these embodiments relate to a semiconductor package liquid cooling system structure, material, and cooling method that reduces the thermal resistance of a heat path, increases the flow rate of cooling fluid in a region where the amount of generated heat is relatively large, and reduces leakage and stress.

In an embodiment, a cooling apparatus may include a microchannel structure including a plurality of microchannels and a manifold disposed over the plurality of microchannels. The microchannel structure may be directly bonded to a chip and dissipate heat generated in the chip during an operation of the chip.

In an embodiment, a semiconductor device may include a chip and a cooling apparatus directly bonded to the chip and dissipating heat generated in the chip during an operation of the chip. The cooling apparatus including a plurality of microchannels and a manifold disposed over the plurality of microchannels.

In an embodiment, a method of fabricating a semiconductor device includes doping one or more impurity elements into a base of a cooling apparatus, or a chip, or both, and directly bonding the cooling apparatus to the chip. The semiconductor device may include the chip and the cooling apparatus dissipating heat generated in the chip during an operation of the chip, and the cooling apparatus may include the base, a plurality of microchannels, and a manifold disposed over the plurality of microchannels.

BRIEF DESCRIPTION OF DRAWINGS

FIGS. 5A, 5B, 5C, and 5D illustrate a cooling apparatus including a manifold and a microchannel structure that has a plurality of microchannels, according to an embodiment.

FIGS. 10 and 10B show microchannel structures and manufacturing methods thereof according to embodiments.

DETAILED DESCRIPTION

Embodiments of the present application relate to a photodiode device, a photodetector including the photodiode device, and a method of forming the photodiode device.

A detailed description of embodiments is provided below along with accompanying figures. The scope of this disclosure is limited by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Figure 1A:
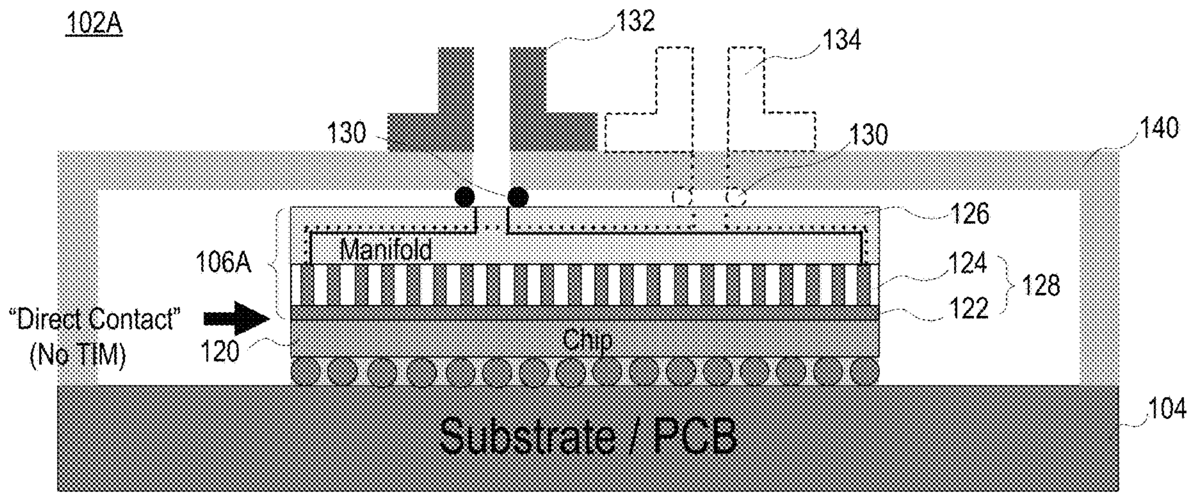
FIG. 1A illustrates a semiconductor device according to an embodiment.

FIG. 1A shows a semiconductor device 102A including first and second ports 132 and 134, a microchannel structure 128 and a chip (or a die) 120 that are in direct contact without an intervening layer (e.g., Thermal Interface Material), according to an embodiment. Specifically, such a device 102A may include a cooling apparatus 106A and a chip 120 that directly contacts a bottom surface of the cooling apparatus 106A, and the cooling apparatus 106A includes a manifold 126 and the microchannel structure 128, the microchannel structure 128 having a plurality of microchannels 124, and a base 122. For example, each of the plurality of microchannels 124 may be defined by a pair of adjacent fins and a portion of the base 122 disposed between the adjacent fins.

In order to minimize the thermal resistance in a cooling path between a coolant flow through the microchannels 124 and the chip 120 with a heat source, a structure for directly bonding the cooling apparatus 106A to the chip 120 is shown in FIG. 1A. In an embodiment, the bonding process temperature is not higher than the melting temperature of the already assembled material. Specifically, the bonding process temperature may not be higher than melting temperatures of materials included in the cooling apparatus 106A and the chip 120. For example, direct bonding between the cooing apparatus 106 to the chip 120 may be performed using one or more of the following methods:

(1) Fusion Bonding/Direct or molecular bonding;

(2) Cu—Cu/Oxide Hybrid Bonding at a room temperature (RT); and (3) Anodic Bonding.

In an embodiment, align marks may be placed on the backside of the chip 120 as well as the bottom of the microchannel 124 or the bottom of the base 122 to enable bonding not only of the entire wafer but also of individual unit microchannels or chips.

FIG. 1A shows the embodiment in which the cooling apparatus 106A is directly bonded to chip 120. In the absence of the thermal resistances associated with an intervening layer (e.g., the TIM) itself as well as contact surfaces between the TIM and the cooling apparatus 106A and between the TIM and the chip 120 in a conventional cooling system, a total thermal resistance in a cooling system according to an embodiment of the present disclosure can be reduced compared to that of the conventional cooling system.

Figure 1B:
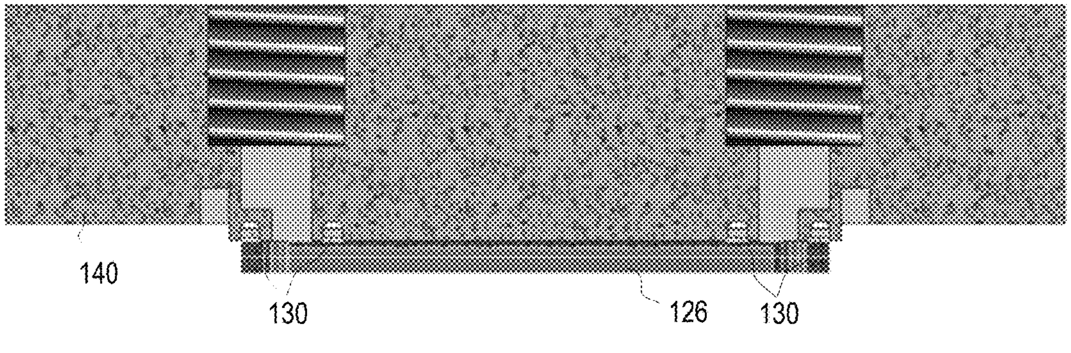
FIG. 1B illustrates an enlarged view of a region including a portion of a cover and a manifold of the semiconductor device of FIG. 1A, according to an embodiment.

Moreover, it may be desirable to increase the sealing force so that the liquid or vapor does not substantially leak even after using the liquid cooling device for a relatively long time. In an embodiment, when a mechanical seal (e.g., an O-ring) 130 is used as shown in FIG. 1A, the mechanical seal 130 can allow horizontal deformation in temperature-dependent deformation and maintain the vertical sealing force of a connecting part. Specifically, a cover (e.g., a lid) 140 may be connected to the substrate/PCB 104 with adhesive. Because the lid 140 and the substrate 104 may be relatively strongly bonded, the lid 140 and the manifold 126 can be closely adhered to each other with the O-ring 130 therebetween. Specifically, when an opening of the lid 140 may be coupled to a first portion (e.g., an upper portion) of the manifold 126 and a second portion (e.g., a lower portion) of the manifold 126 may be coupled to a plurality of microchannels 124, the O-ring 130 may be disposed between the lid 140 and the upper portion of the manifold 126 to substantially prevent liquid, gas, or both from leaking. In the embodiment shown in the cross-sectional view of FIG. 1B, two O-rings 130 may be disposed over a top surface of the manifold 126, such that each of the O-rings 130 may be inserted into a recess formed on a bottom surface of the cover 140. The recess may have a closed-loop shape (e.g., a substantially rectangular shape) when seen in a top view.

Figure 1C:
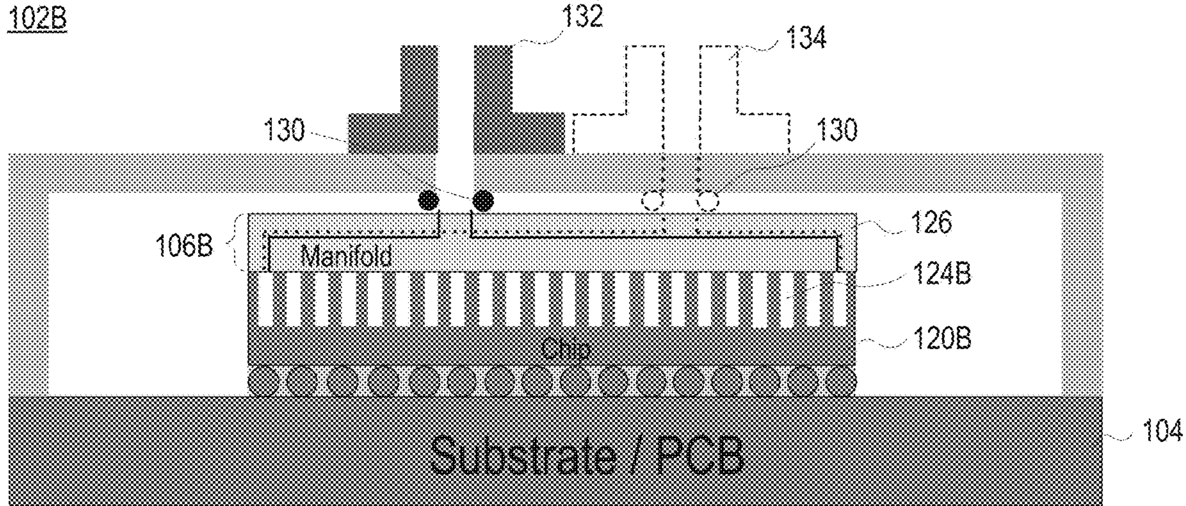
FIG. 1C illustrates a semiconductor device according to another embodiment.

As another method to reduce the thermal resistance between the cooling apparatus and the chip, a plurality of microchannels may be formed on a back portion of the chip. As shown in the embodiment of FIG. 1C, a plurality of microchannels 124B are formed in a back portion of a chip 120B through semiconductor process to secure a relatively large height of the microchannels 124B. In an embodiment, the minimum thermal resistance can be secured by having the minimum chip thickness and maximum height of the microchannel in the chip 120B. For example, the height of each of the microchannels 124B may be sufficiently large to increase its aspect ratio (e.g., in a range from about 1 to about 60) and surface area for minimizing the thermal resistance and sufficiently short to ensure a proper operation of the chip 120B and the structural integrity of the chip 120B. In other embodiments (e.g., embodiments shown in FIGS. 9A and 9B), a plurality of plates including microchannels may be stacked to form combined microchannels each having an aspect ratio higher than that of the microchannel 124B of FIG. 1C.

Figure 2:
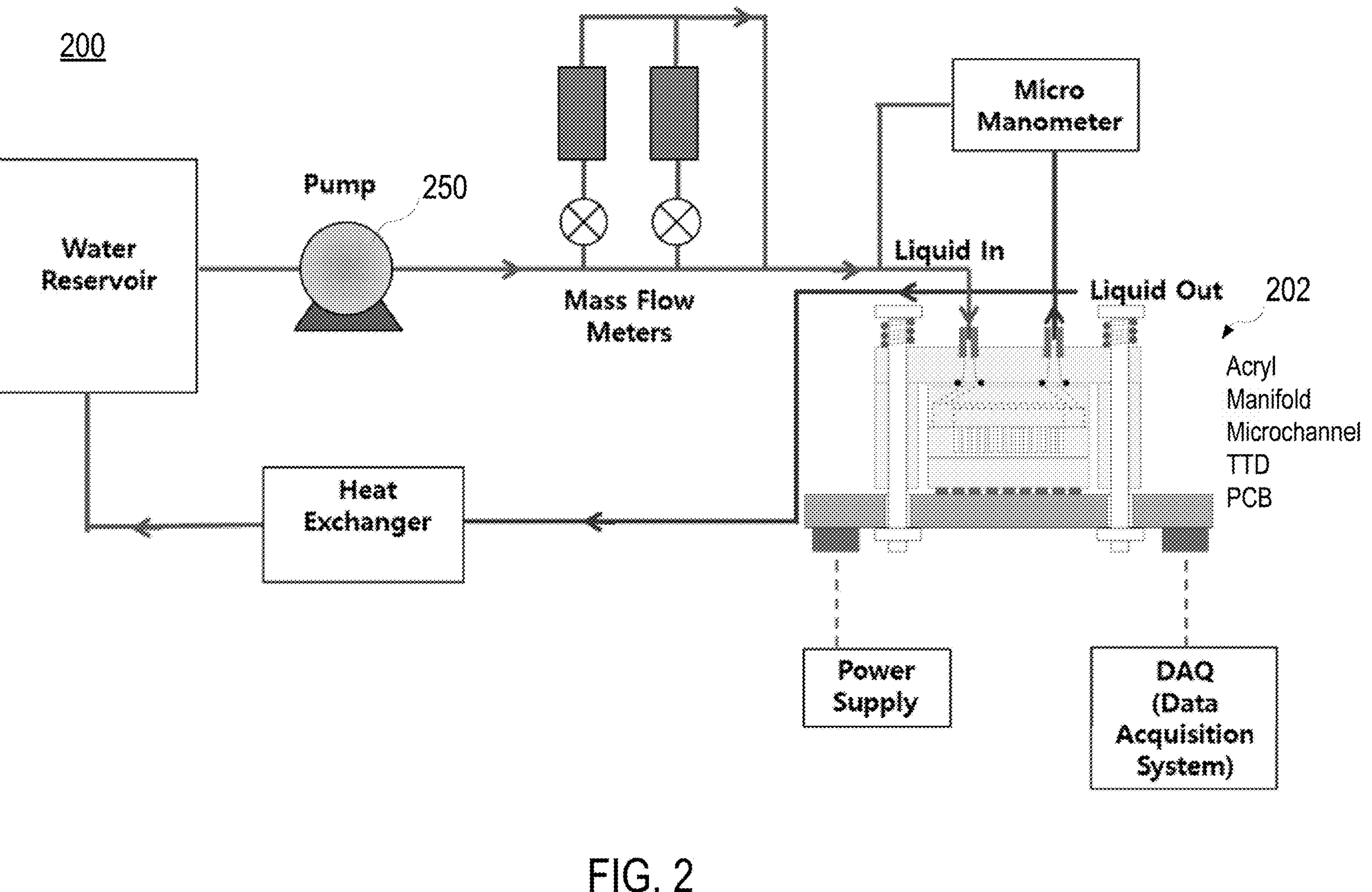
FIG. 2 illustrates a cooling system including a semiconductor device and an external pump disposed outside the semiconductor device, according to an embodiment.

FIG. 2 shows a cooling system 200 including a semiconductor device 202 (e.g., the semiconductor device 102A in FIG. 1A) and an external pump 250 disposed outside the semiconductor device 202, according to an embodiment.

Figure 3:
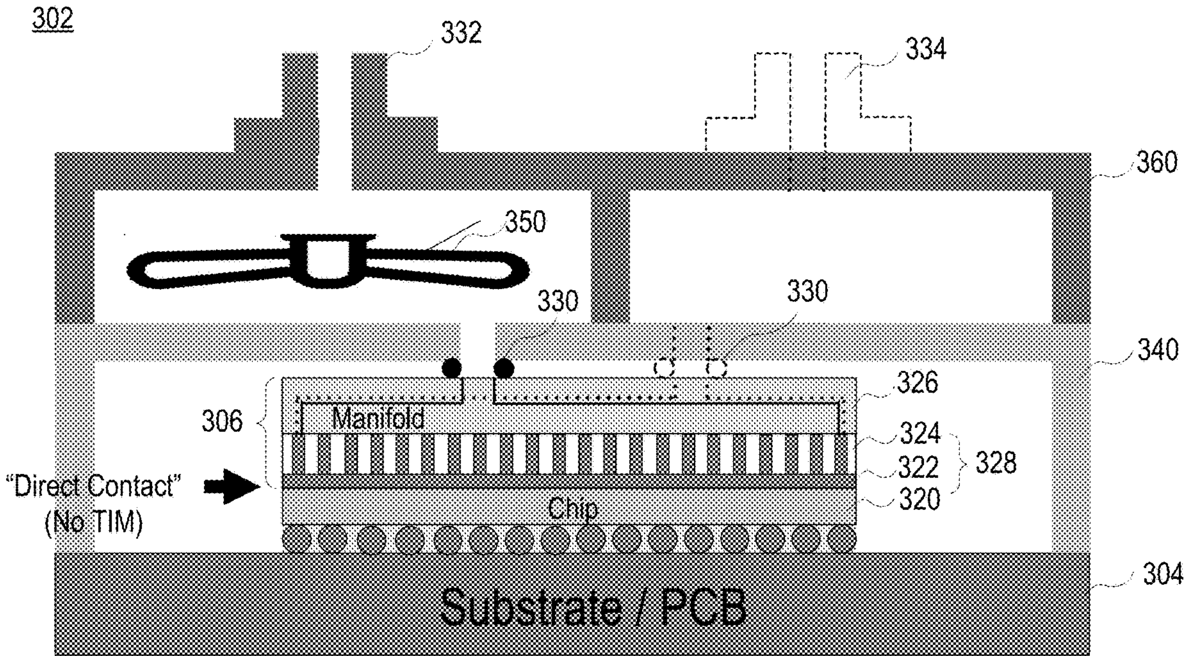
FIG. 3 illustrates a semiconductor device according to an embodiment.

FIG. 3 illustrates a semiconductor device 302 according to an embodiment. The semiconductor device 302 in FIG. 3 includes elements (e.g., a base 322, a plurality of microchannels 324, a mechanical seal 330, first and second ports 332 and 334) similar to those of the semiconductor device 102A in FIG. 1, 102B in FIG. 1C, or 202 in FIG. 2, and thus detailed descriptions on these elements may be omitted in the interest of brevity.

The embodiment shown in FIG. 3 differs from the embodiments shown in FIGS. 1A, 1C, and 2 in that the semiconductor device 302 according to the embodiment of FIG. 3 includes a pump 350 inserted between a first port (e.g., an inlet port) 332 and a cooling apparatus 306, the cooling apparatus 306 including a manifold 326. For example, the semiconductor device 302 may include a first cover 340 coupled to a substrate 304 to cover the cooling apparatus 306 and the chip 320, and a second cover 360 disposed over the first cover 340 and including the inlet port 332. The pump 350 may be positioned between the inlet port 332 of the second cover 360 and an opening of the first cover 340 to which the manifold 326 of the cooling apparatus 306 is coupled, thereby directing a coolant flow from the inlet port 332 of the second cover 360 to the manifold 326 through the opening of the first cover 340. In the semiconductor device 302 of FIG. 3, the pump 350 is built-in within each of a plurality of semiconductor devices 302, thereby precisely controlling the flow rate into each of the semiconductor devices 302 and facilitating installation of the pump compared to when a pump is installed outside a corresponding one of the semiconductor devices.

Figures 4A, 4B, 4C:
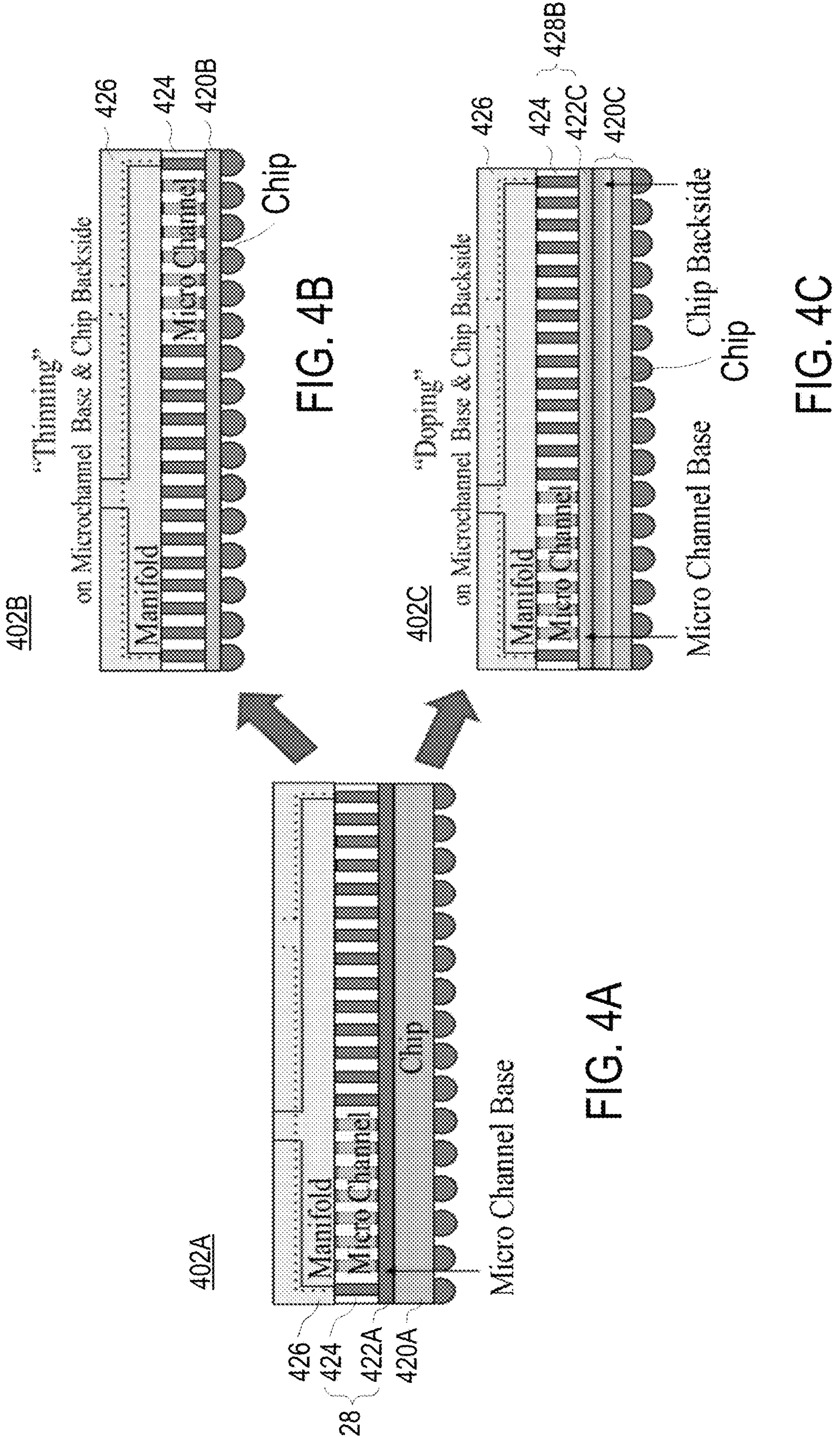
FIG. 4A illustrates a semiconductor device without an intervening layer according to an embodiment.
FIG. 4B illustrates a semiconductor device obtained by reducing (or thinning) a thickness of a base and a thickness of a chip of the semiconductor device in FIG. 4A, according to an embodiment.
FIG. 4C illustrates a semiconductor device including a base and a back portion of the chip doped with one or more impurities to increase thermal conductivity, according to an embodiment.

FIG. 4A illustrates a semiconductor device 402A including a manifold 426 and a microchannel structure 428 without an intervening layer (e.g., Thermal Interface Material) suitable for use as the semiconductor device 102A shown in FIG. 1A. FIGS. 4B and 4C illustrate semiconductor devices 402B and 402C each having a further reduced thermal resistance between a coolant (e.g., liquid) flowing through a plurality of microchannels and a chip, compared to that of the semiconductor device 402A shown in FIG. 4A, according to embodiments. As a measure to reduce the thermal resistance between the liquid and the chip, it is desirable to make the distance between the liquid and the chip close as possible and to increase the thermal conductivity of each of one or more materials therebetween. Specifically, FIG. 4B illustrates the semiconductor device 402B obtained by reducing (or thinning) a thickness of a base 422A and a thickness of a chip 420A of the semiconductor device 402A in FIG. 4A. FIG. 4C illustrates the semiconductor device 402C including a base 422C and a back portion of the chip 420C that are doped with one or more impurities to increase thermal conductivity.

Referring to FIG. 4B, thinning can be applied to the base 422A and a back portion of the chip 420A of the semiconductor device 402A in FIG. 4A together. However, embodiments of the present disclosure are not limited thereto, and it can be applied to either the base 422A or the back portion of the chip 420A. In an embodiment, the reduced thickness of the base may be sufficiently small in order to minimize the distance between the liquid and the chip, or the semiconductor chip may be ground to have a given thickness, or both. For example, the thickness of the base may be substantially equal to zero, such that a plurality of fins defining the plurality of microchannels 424 are directly bonded to a surface (e.g., a top surface) of the chip 420B to make a coolant directly contact the surface of the chip 420B while flowing through the plurality of microchannels 424. The given thickness of the chip 420B may be determined based on the strength of structure. Specifically, the thickness of the chip 420B may be sufficiently large to substantially prevent an occurrence of fracture during bonding process, and sufficiently small to minimize the thermal resistance associated therewith. For example, the thickness of the chip may be in a range from 3 μm to 10 μm.

Also, to increase the thermal conductivity of the material, doping with one or more impurity elements (e.g., Boron Arsenide or Boron Phosphorous) may be performed on a base, or a portion (e.g., a back portion) of a chip, or both, thereby making at least a portion of the base, or a portion of the Chip, or both include the impurity elements. Referring to FIG. 4C, the base 422C of the microchannel structure 428B and the back portion of the chip 420C of the semiconductor device 402C are doped with impurities. In an embodiment, doping may be performed by diffusion and implantation of Boron Arsenide or Boron Phosphor. For example, a diffusion source in solid, liquid, or gaseous state can be brought into contact with silicon included in the base and the chip, and diffused at a relatively high temperature, or impurities can be injected into the base and chip backside and then diffused at a relatively high temperature. Depending on the diffusion thickness and desirable concentration, one or more diffusion methods may be selected. In addition, a method of selectively diffusing one or more necessary parts can be performed. Doping can be applied to the base and the back portion of the chip together, or can be applied to either the base or the back portion of the chip. In an embodiment, doping may be performed to diffuse both into the microchannel base and the chip backside to reduce thermal resistances associated with the microchannel base and the chip together. However, it may be desirable to consider the manufacturing cost and time, check whether the diffusion in a direction from the chip backside to the chip front side does not significantly deteriorate the reliability of the chip, and select the target and depth for diffusion. For example, a depth for diffusion into the chip may be in a given range to sufficiently increase the thermal conductivity of the chip and to substantially prevent one or more operations of circuit elements implemented in the chip from being significantly interrupted. In an embodiment, diffusion may occur in not only the base of the microchannel structure, but also in one or more fins of the microchannel structure.

Although thinning and doping are separately applied to the embodiments shown in FIGS. 4B and 4C, embodiments of the present disclosure are not limited thereto. In another embodiment, thinning and doping may be used in combination. For example, thinning and doping may be applied together to the base, or the back portion of the chip, or both.

FIGS. 5A to 5D illustrate a cooling apparatus 506 including a manifold 526 and a microchannel structure 528 that has a plurality of microchannels 524 according to an embodiment. Specifically, FIG. 5C illustrates the cooling apparatus 506 with a single zone of controlling a flow rate through the manifold 526 and the plurality of microchannels 524. FIG. 5D illustrates a three-dimensional view of a portion (indicated as the dashed box in FIG. 5C) of the cooling apparatus 506 according to an embodiment.

Referring to FIGS. 5A to 5D, a coolant fluid flows into an inlet hole 572 of the manifold 526 and flows through a main inlet channel 594 and a plurality of inlet subchannels 592 in the manifold 526. While flowing through the inlet subchannels 592 in a longitudinal direction thereof, a portion of the coolant fluid flows down to the microchannels 522, flows through a plurality of outlet subchannels 590 and a main outlet channel 596, and then exits through an outlet hole 582 of the main outlet channel 596.

Although the embodiment shown in FIGS. 5A to 5D has a single zone for controlling the entire flow rate through the channels of the manifold 526 and the plurality of microchannels 522, embodiments of the present disclosure are not limited thereto. In other embodiments, a semiconductor device may have two or more zones for controlling respective flow rates through corresponding channels of a manifold (e.g., a manifold 626 in FIG. 6C) and microchannels (e.g., microchannels 624 in FIG. 6C). For example, in order to reduce the total pressure drop and improve the efficiency of heat dissipation, embodiments of the present disclosure divides the manifold into two or more zones so that a relatively large amount of flow can flow where the power generated in the entire chip is relatively high, and thus the flow rates in different zones may vary, or the flow rate in the same zone may vary, or both. By reducing the pressure drop of the cooling apparatus, the operating cost can be reduced by lowering the pumping power required for a given amount of heat dissipation, or more heat can be dissipated while operating with substantially the same pumping power.

Figures 6A, 6B, 6C:
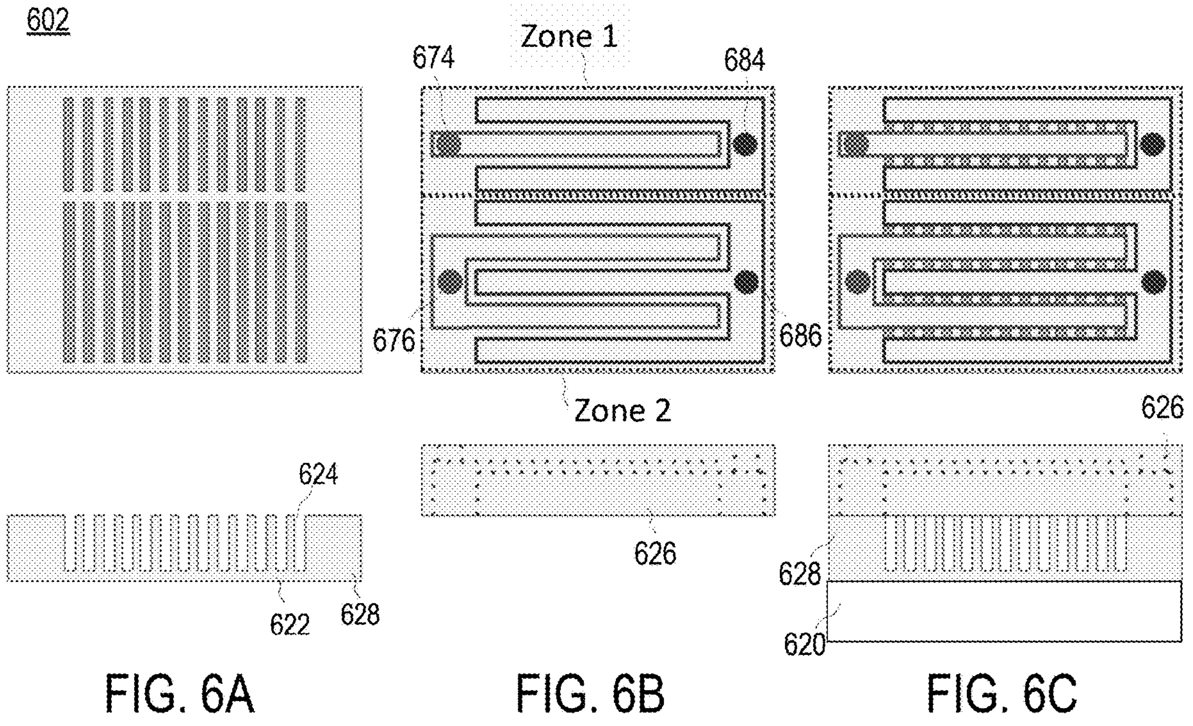
FIGS. 6A, 6B, and 6C illustrate a cooling apparatus including a manifold and a microchannel structure that has a plurality of microchannels, according to another embodiment.

FIGS. 6A, 6B, and 6C illustrates a cooling apparatus 602 including a manifold 626 and a microchannel structure 628 that has a base 622 and a plurality of microchannels 624 according to an embodiment. Specifically, FIGS. 6B and 6C illustrate a semiconductor device with a first zone Zone 1 for controlling a first flow rate through a first plurality of microchannels and a second zone Zone 2 for controlling a second flow rate through a second plurality of microchannels.

If there are two or more zones, a flow distribution device can be made for flow distribution. Zones are divided based on their Power Density level and whether they operate independently. In an embodiment, if the chip includes a region with high power density and a region with low power density, the manifold 626 and the plurality of microchannels 624 may be divided into two zones. For example, referring to FIGS. 6B and 6C, a first zone (indicated by an upper dashed box) Zone 1 may be disposed over a first region of a chip where a first amount of heat with relatively high power density is generated during an operation of the chip and include an inlet hole 674, a first plurality of micro channels intersecting with a single path of the manifold 626, and an outlet hole 684. In addition, a second zone (indicated by a lower dashed box) Zone 2 may be disposed over a second region of the chip where a second amount of heat with relatively low power density is generated during the operation of the chip and include an inlet hole 676, a second plurality of microchannels intersecting with two paths of the manifold 626, and an outlet hole 686. In an embodiment, a flow rate in a specific zone may be controlled based on an amount of heat generated in a corresponding area of a chip over which the specific zone is located, or a degree of non-uniformity in a distribution of the generated heat, or both. For example, when a first amount of heat generated in a first area of a chip is greater than a second amount of heat generated in a second area of the chip, a first flow rate in the first zone over the first area to dissipate the first amount of heat may be greater than a second flow rate in the second zone over the second area to dissipate the second amount of heat. When a first distribution of heat generated in a first area of the chip is more non-uniform compared to a second distribution of heat generated in a second area of the chip, a first flow rate in a first zone over the first area of the chip may be greater than a second flow rate in a second zone over the second area of the chip. A first flow rate per unit area of a first zone to dissipate heat generated in a first region of a chip with first power density may be controlled to be greater than a second flow rate per unit area of a second zone to dissipate heat generated in a second region of the chip with second power density, the first power density being greater than the second power density, the area of the first zone and the area of the second zone being defined when seen from a top view of a semiconductor device.

Figure 7:
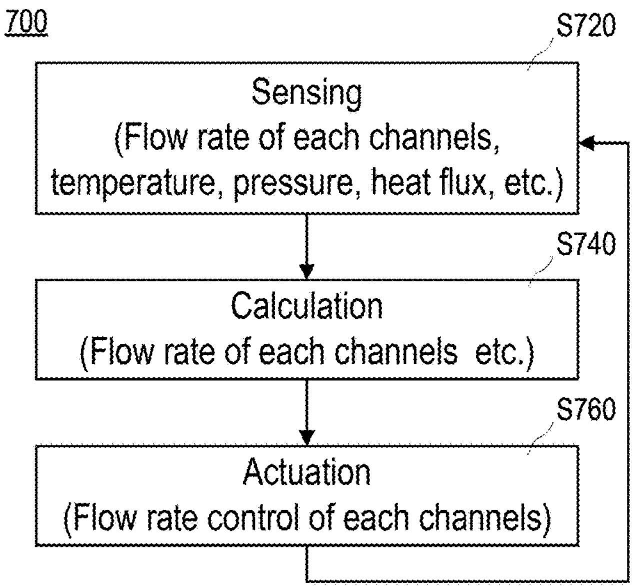
FIG. 7 illustrates a process of operating a flow distribution device according to an embodiment.

FIG. 7 illustrates a process 700 of operating a flow distribution device according to an embodiment. The flow distribution device may include a sensing (ex. temperature, power) part, a calculation part for control, and an actuator part, and it is characterized by a feedback control.

By making a manifold (e.g., the manifold in FIGS. 6B and 6C) have more than two zones, it is possible to increase the flow rate intensively where necessary, and it includes automatic feedback control of the flow rate by sensing temperature or power. In an embodiment, the flow distribution device may (1) control a flow rate of a zone according to a sensed temperature based on a predetermined relationship (e.g., a table) between the flow rate and the sensed temperature, or (2) using a PID control, and controlling the flow rate according to a temperature margin (e.g., a difference between a sensed temperature and a target temperature), or (3) controlling the flow rate based both of the table and the PID control. For example, at S720, a sensing part (e.g., one or more sensors) may measure one or more of a flow rate of each channel, a temperature, a pressure, and heat flux. At S740, a calculation part for control (e.g., a controller) may perform calculations for a predetermined control method (e.g., PID control). At S760, the controller may control an operation of an actuator part (e.g., one or more actuators) to control a flow rate based on the measurement and calculation results. These steps S720, S740, and S760 may be repeated until one or more predetermined conditions are satisfied, for example, when a difference between a sensed temperature and a target temperature becomes substantially equal to or less than a given threshold.

In order to lower the temperature of the chip even at the same flow rate, the heat transfer area may be increased, the heat transfer coefficient may be increased, or both. If the surface of the microchannel is roughened, not only the surface area of the microchannel increases, but also the effective heat transfer coefficient can be increased by promoting boiling and turbulence of the coolant flow. To increase the surface area of the microchannel, as shown in FIGS. 8A to 8E, a method of arbitrarily generating scallops by controlling the process conditions during etching, or attaching particles, etc. to the surface may be performed after microchannel formation.

Figures 8A, 8B, 8C, 8D, 8E:
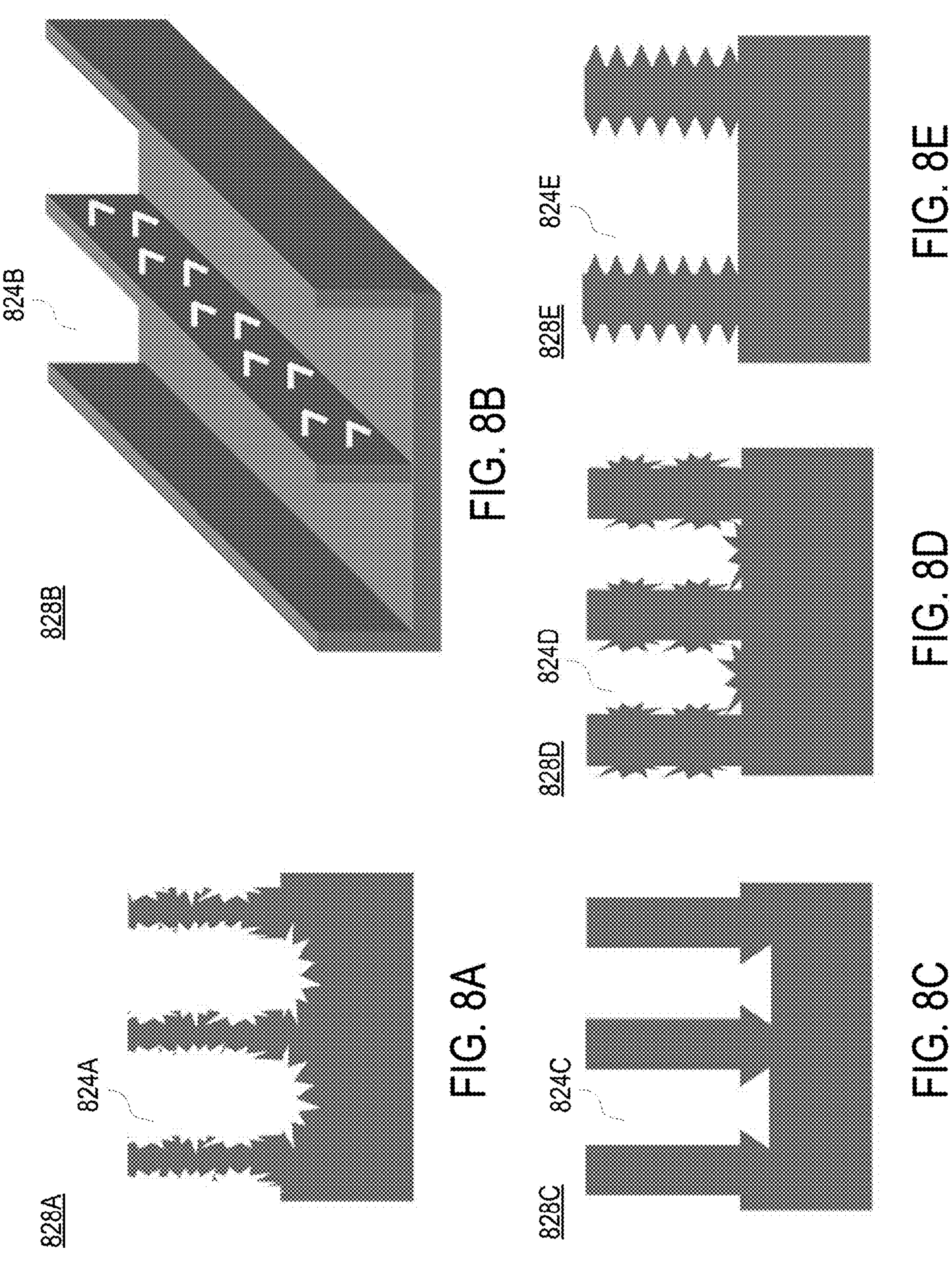
FIGS. 8A, 8B, 8C, 8D, and 8E illustrates microchannel structures according to embodiments.

The microchannel structure 828A including microchannels 824A according to the embodiment shown in FIG. 8A may be implemented by forming deep trenches, attaching particles on surfaces of the deep trenches, and performing an etching process. Specifically, the attached particles may function as hard mask patterns to etch exposed portions of the deep trenches during the etching process, thereby forming the structure shown in FIG. 8A. Optionally, the attached particles may be removed after the etching process is complete.

The microchannel structure 828B according to the embodiment shown in FIG. 8B may include a plurality of structures to facilitate formation of a turbulent flow of a coolant flowing through microchannels 824B to increase heat transfer. In an embodiment, the plurality of structures are disposed on sidewalls of fins defining the microchannels 824B, and each of the plurality of structures oscillates toward and away from a corresponding sidewall on which it is disposed when a coolant flows through the microchannel 824B. For example, the structures may be disposed on sidewalls of the microchannels 824B and have a feather shape or a fish scale shape to oscillate in a direction perpendicular to the main flow direction of the coolant.

The microchannel structure 828C including microchannels 824C according to the embodiment shown in FIG. 8C may be implemented by forming deep trenches, forming a passivation layer (e.g., an oxidation layer) over surfaces of the deep trenches, forming openings in the passivation layer to expose portions of bottom surfaces of the deep trenches, and performing an etching process on the exposed portions of the bottom surfaces of the deep trenches to form lower portions of the microchannels each having a cross-sectional area with a substantially trapezoidal shape. When the lower portions of the microchannels 824C each have a cross-sectional area having a trapezoidal shape with an upper edge shorter than a lower edge, as shown in the embodiment of FIG. 8C, the initial vapor generation temperature can be lowered and heat transfer by boiling can be increased. For example, the openings in the passivation layer may be formed to expose center portions of the bottom surfaces of the deep trenches by forming a photoresist layer over the passivation layer, performing a first tilted lithography and a second tilted lithography on portions of the photoresist layer over the center portions of the bottom surfaces of the deep trenches, and developing the photoresist layer to expose the center portions of the bottom surfaces of the deep trenches.

The microchannel structure 828D including microchannels 824D according to the embodiment shown in FIG. 8D may be implemented by forming deep trenches, depositing at least one metal element (e.g., copper) on sidewalls and bottom surfaces of the deep trenches, and forming at least one metal oxide having a flower-like shape using a chemical compound. For example, the metal oxide may include CuO and the chemical compound may include NaOH.

The microchannel structure 828E including microchannels 824E according to the embodiment shown in FIG. 8E may be implemented by forming scalloped deep trenches. For example, forming the scalloped deep trenches may include performing a plurality of sub-cycles, each of the sub-cycles including performing an etching process and removing byproducts (e.g., polymer) that result from the etching process.

Figures 9A, 9B:
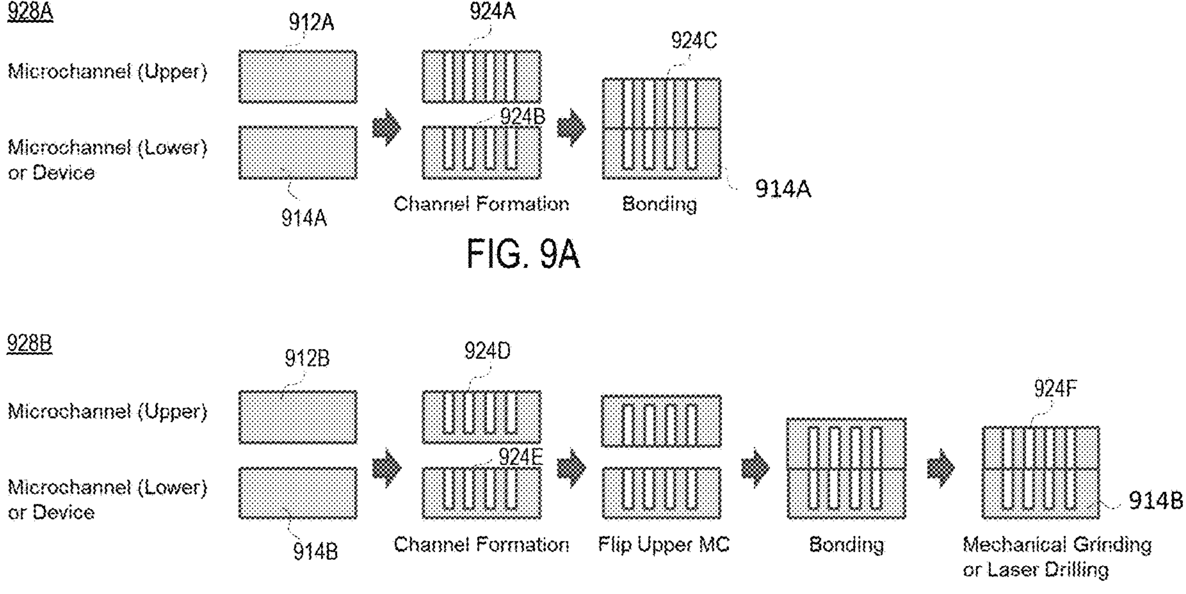
FIGS. 9A and 9B show microchannel structures and manufacturing methods thereof according to embodiments.

FIGS. 9A and 9B each show a microchannel structure and a manufacturing method thereof according to embodiments.

Each of the microchannel structure 928A and 928B in FIGS. 9A and 9B may be suitable for use as a microchannel structure (e.g., the microchannel structure 128 shown in FIG. 1) according to an embodiment of the present disclosure.

Referring to FIG. 9A, a plurality of first microchannels 924A are formed in a first plate (e.g., an upper plate) 912A, and a plurality of second microchannels 924B are formed in a second plate (e.g., a lower plate) 914A. The first microchannels 924A may have substantially the same channel width and pitch as those of the second microchannels 924B. For example, each of the first microchannels 924A may be a through-type channel that completely penetrates the upper plate 912A in a vertical direction, and each of the second microchannels 924B may partially penetrate the lower plate 914A in the vertical direction. A bottom surface of the upper plate 912A having the first microchannels 924A may be bonded to an upper surface of the lower plate 914A having the second microchannels 924B, resulting in the microchannel structure 928A having a plurality of microchannels 924C.

Referring to FIG. 9B, a plurality of third microchannels 924D are formed in an upper plate 912B, and a plurality of fourth microchannels 924E are formed in a lower plate 914B. The third microchannels 924D may have substantially the same channel width and pitch as those of the fourth microchannels 924E. Each of the third microchannels 924D may partially penetrate the upper plate 912B in a vertical direction, and each of the fourth microchannels 924E may partially penetrate the lower plate 914B in the vertical direction. After forming the third micro channels 924D without penetrating a lower portion of the upper plate 912B, the upper plate 912B may be turn over and bonded to the lower plate 914B having the fourth micro channels 924E. Subsequently, an upper portion of the resulting structure may be removed through grinding, or a plurality of upper portions respectively corresponding to the third microchannels 924D may be removed through laser drilling. As a result, the microchannel structure 928B having a plurality of microchannels 924F may be formed.

The first method shown in FIG. 9A has fewer process steps compared to the second method shown in FIG. 9B. However, if there are one or more risk factors in handling the upper plate 912A having the first microchannels 924A, the second method may be used to fabricate a microchannel structure. For example, since the first microchannels 912A completely penetrate the upper plate 912A, the upper plate 912A may be susceptible to damage while bonding it to the lower plate 914A depending on the size and/or depth of the first microchannels 924A. Although each of the stack structures 928A and 928B according to the embodiments shown in FIGS. 9A and 9B includes two plates, embodiments of the present disclosure are not limited thereto. For example, a microchannel structure may include three or more plates each including a plurality of microchannels, and may be fabricated by repeating the stacking of layers using the above-described methods.

Figures 10A, 10B:
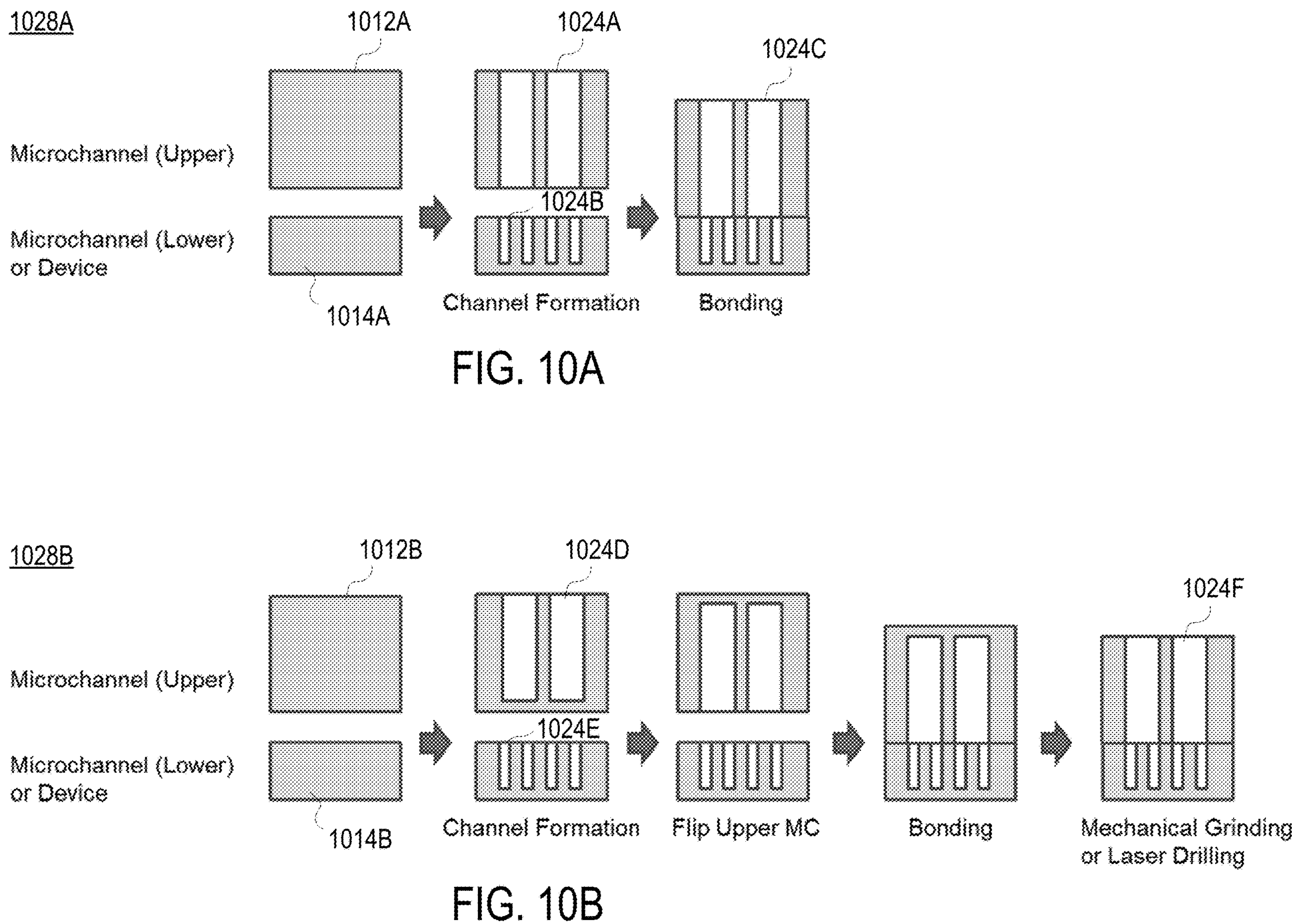

FIGS. 10A and 10B each show a microchannel structure and a manufacturing method thereof according to embodiments. Microchannel structures 1028A and 1028B in FIGS. 10A and 10B include similar elements (e.g., first plates 1012A and 1012B, second plates 1014A and 1014B, etc.) to those of the microchannel structures 928A and 928B in FIGS. 9A and 9B, respectively, and thus detailed descriptions of these elements and manufacturing methods thereof may be omitted for the interest of brevity.

The microchannel structure 1028A in FIG. 10A differs from the microchannel structure 928A in FIG. 9A in that the microchannel structure 1028A includes a plurality of first microchannels 1024A and 1024C having different channel widths and pitches from those of a plurality of second microchannels 1024B. For example, the first microchannels 1024A have channel widths and pitches greater than those of the second microchannels 1024B.

The microchannel structure 1028B in FIG. 10B differs from the microchannel structure 928B in FIG. 9B in that the microchannel structure 1028B includes a plurality of third microchannels 1024D and 1024F having different channel widths and pitches from those of a plurality of fourth microchannels 1024E. For example, the third microchannels 1024D have channel widths and pitches greater than those of the fourth microchannels 1024E.

Stacking microchannels with different channel widths and pitches as shown in the embodiments of FIGS. 10A and 10B may increase the surface area while more uniformly distributing the flow, compared to the embodiments shown in FIGS. 9A and 9B.

Although each of the stack structures 1028A and 1028B according to the embodiments shown in FIGS. 10A and 10B includes two plates, embodiments of the present disclosure are not limited thereto. For example, a microchannel structure may include three or more plates each including a plurality of microchannels, and may be fabricated by repeating the stacking of more layers using stacking methods similar to the above-described methods with reference to FIGS. 9A and 9B. It may be desirable to have relatively wide channel widths in terms of flow distribution, but various channel widths can be stacked in various combinations for other purposes (e.g., turbulence formation) to increase cooling efficiency.

FIG. 11A to 11I illustrate manifold structures and methods for adjusting flow distribution according to embodiments of the present disclosure.

Figure 11A:
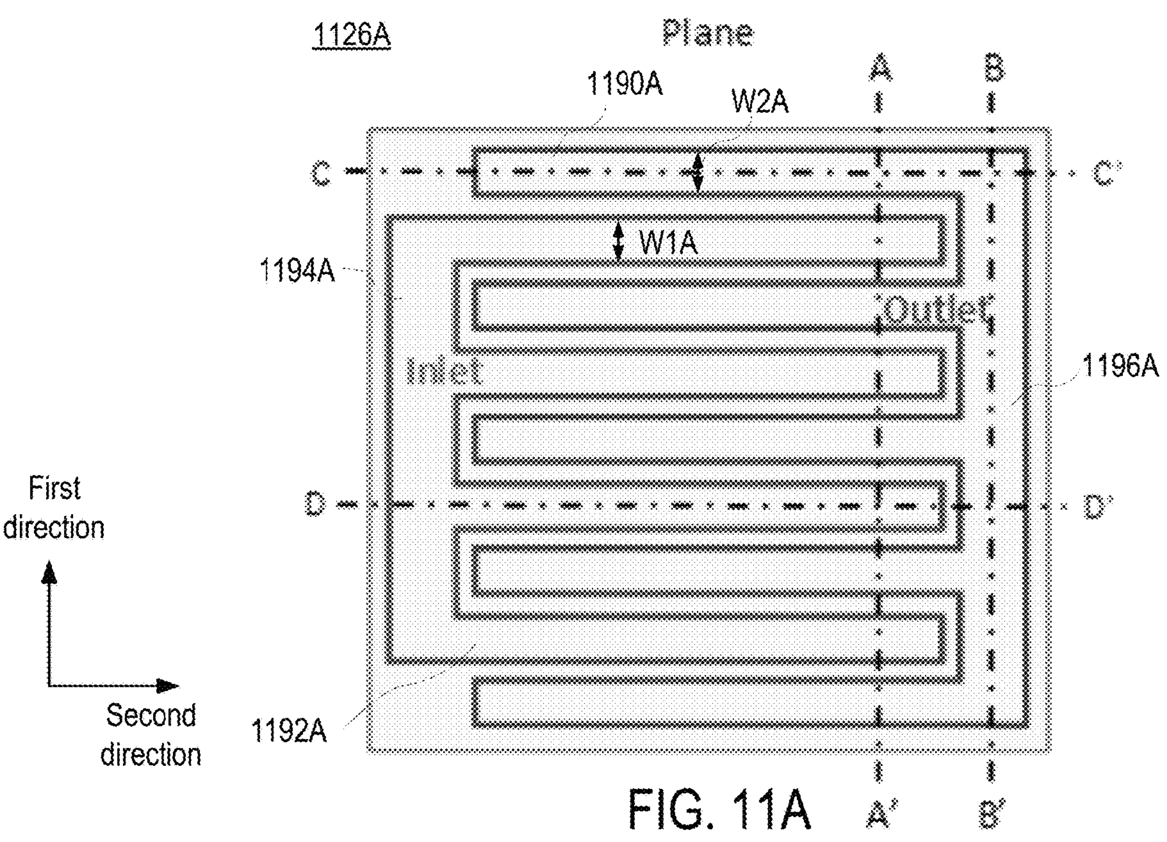
FIGS. 11A, 11B, 11C, 11D, 11E, 11F, 11G, 11H, and 11I illustrate structures of a manifold according to embodiments.

FIG. 11A is a plan view of a manifold 1126A according to an embodiment of the present disclosure. The manifold 1126A in FIG. 11A includes an inlet main channel 1194A, a plurality of inlet subchannels 1192A, an outlet main channel 1196A, and a plurality of outlet subchannels 1190A. The inlet main channel 1194A may include an inlet hole (e.g., the inlet hole 572 in FIG. 5B) and be coupled to the inlet subchannels 1192A. The outlet main channel 1196A may include an outlet hole (e.g., the outlet hole 582 in FIG. 5B) and be coupled to the outlet subchannels 1190A. Each of the inlet subchannels 1192A may have a substantially constant cross-sectional area along a specific direction (e.g., a longitudinal/second direction with respect to FIG. 11A) through which a coolant flows. For example, the cross-sectional area of the inlet subchannel 1192A may have a width W1A in a first direction and a height in a third direction orthogonal to a plane defined by the first direction and the second direction, and the width W1A and the height may be substantially constant along the second direction. Similarly, the cross-sectional area of the outlet subchannel 1190A may have a width W2A in the first direction and a height in the third direction, and the width W2A and the height may be substantially constant along the second direction.

Figure 11B:
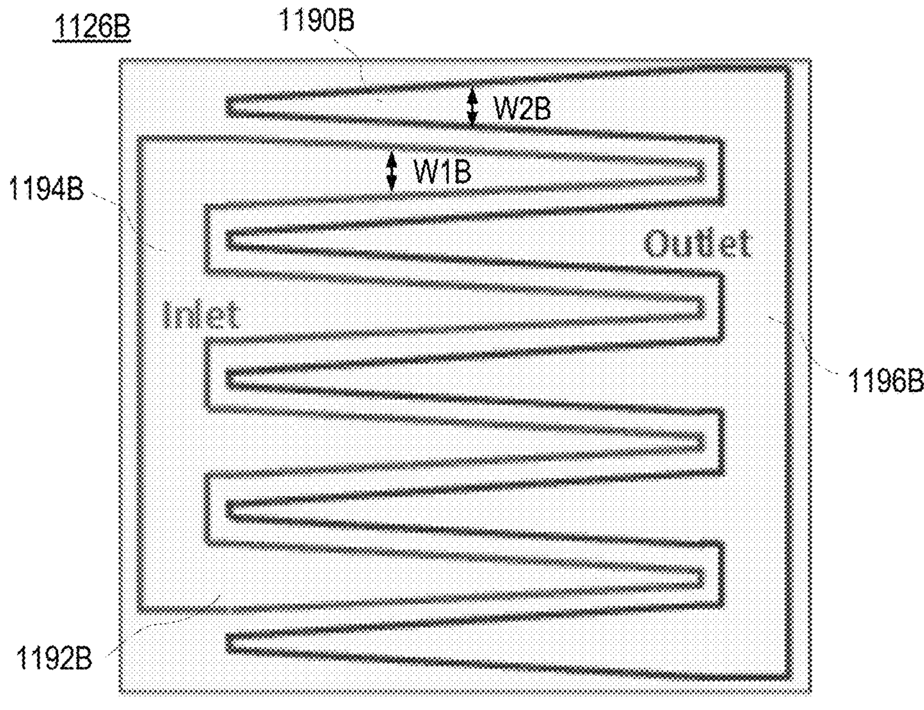

FIG. 11B is a plan view of a manifold 1126B according to another embodiment of the present disclosure. The manifold 1126B in FIG. 11B includes an inlet main channel 1194B, a plurality of inlet subchannels 1192B, an outlet main channel 1196B, and a plurality of outlet subchannels 1190B. The inlet main channel 1194A may extend in a first direction and receive a coolant fluid, and each of the inlet subchannels 1192B may be coupled to the inlet main channel 1194A and extend in a second direction, the second direction being perpendicular to the first direction. The outlet main channel 1196A may extend in the first direction and discharge the coolant fluid, and each of the outlet subchannels 1190A may be coupled to the outlet main channel 1196A and extend in the second direction. Each of the inlet subchannels 1192B may have a width W1B in the first direction that decreases along the second direction (or the longitudinal direction) through which the coolant flows, thereby obtaining a substantially uniform flow distribution. Specifically, when a coolant fluid flows through the inlet subchannel 1192B in the longitudinal direction, a portion of the coolant fluid flows down to microchannels (e.g., the microchannels 524 in FIG. 5A) to reduce a flow rate of the coolant fluid in the longitudinal direction through a cross-sectional area of the inlet subchannel 1192B. Since the width W1B of the cross-sectional area also decreases in the longitudinal direction, a velocity of the coolant fluid flowing through the cross-sectional area may be maintained substantially uniform along the longitudinal direction. The uniform flow distribution provided by the manifold 1126B makes the temperature of the chip surface uniform. Each of the outlet subchannels 1190B in FIG. 11B may have a width W2B in the first direction that increases along the second direction and be coupled to the outlet main channel 1196B, thereby making vapors generated in a microchannel heat sink including the microchannels under the manifold 1126B move smoothly toward the outlet main channel 1196B. The smooth movement of bubbles toward the outlet main channel 1196B may lower the pressure drop in the chip cooling system and reduce the pumping power supplied to drive the cooling system, thereby reducing energy use and improving cooling efficiency.

Figures 11C, 11D, 11E, 11F, 11G, 11H, 11I:
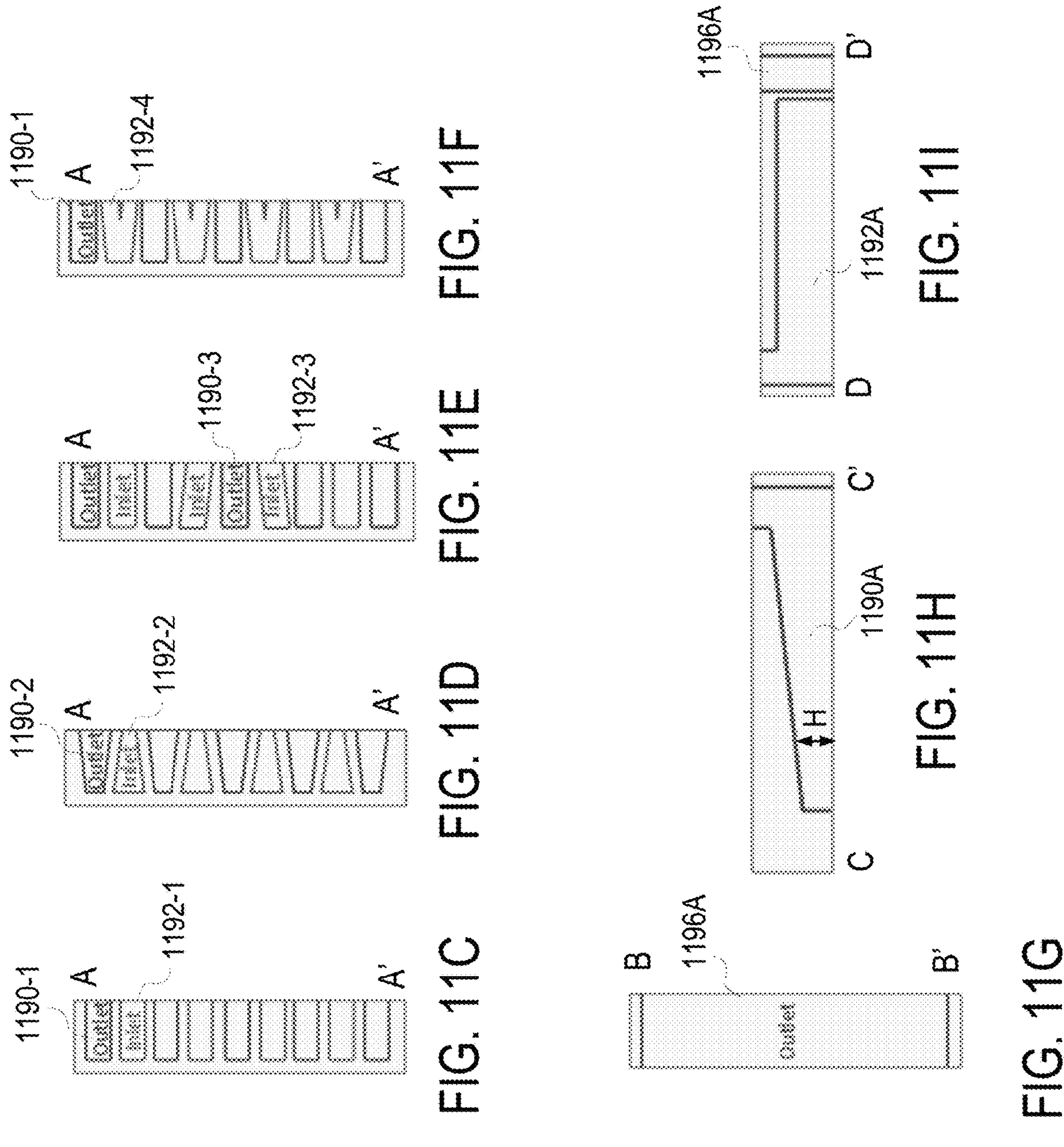

FIG. 11C illustrates a cross-sectional area along the line A-A' of the manifold 1126A in FIG. 11A according to an embodiment. For example, each of the outlet subchannel 1190-1 and the inlet subchannel 1192-1 may have a substantially rectangular cross-sectional area.

FIG. 11D illustrates a cross-sectional area along the line A-A' of the manifold 1126A in FIG. 11A according to an embodiment. For example, when the manifold 1126A is disposed over a microstructure (e.g., the microstructure 528 in FIG. 5C) including microchannels (e.g., the microchannels 524 in FIG. 5C) in a vertically upward direction, a horizonal width of the inlet subchannel 1192-2 may decrease as it approaches the microchannels in a vertically downward direction. As the width of the horizontal width of the inlet subchannel 1192-2 decreases as it gets closer to the microchannels, it is possible to supply fluid with a relatively high fluid velocity to the microchannels through a narrowing passage, thereby improving cooling performance. In addition, a horizontal width of the outlet subchannel 1190-2 increases as it approaches the microchannels in the vertically downward direction, thereby making vapors generated in the microchannel heat sink under the manifold 1126A move smoothly to the outlet subchannel 1190-2 and an outlet main channel (e.g., the outlet main channel 1196A in FIG. 11A) including the exit outlet. The smooth movement of vapors to the outlet may lower the pressure drop in the chip cooling system and reduce the use of supplied pumping power.

FIG. 11E illustrates a cross-sectional area along the line A-A' of the manifold 1126A in FIG. 11A according to an embodiment. For example, the manifold 1126A includes outlet subchannels 1190-3 and inlet subchannels 1192-3, and two or more inlet subchannels 1192-3 each have a cross-sectional area that is tilted vertically to direct the coolant fluid toward a specific region of a microchannel heat sink (e.g., the microchannel structure 528 in FIG. 5C). As a result, a flow rate directed to the specific region may be increased to effectively reduce the temperature of a hot spot generated in the specific region of the microchannel heat sink disposed under the manifold 1126A.

FIG. 11F illustrates a cross-sectional area along the line A-A' of the manifold 1126A in FIG. 11A according to an embodiment. For example, a horizontal width of the inlet subchannel 1192-4 increases as it approaches the microchannels in the vertically downward direction, and the inlet subchannel 1192-4 has two portions (e.g., branches) through which the flow is divided and injected into the microchannels, thereby reducing the flow resistance and increasing the flow rate. In addition, by making the inlet subchannel 1192-4 have two branches, vapors generated in the microchannel heat sink under the manifold 1126A may be moved smoothly to outlet subchannels 1190-1 located on both sides of the inlet subchannel 1192-4. For example, by making the inlet subchannel 1192-4 have two lower portions that are respectively tilted toward a pair of the outlet subchannels 1190-1 located adjacent to the inlet subchannel 1192-4, vapors generated in the microchannel heat sink may be moved smoothly to the outlet subchannels 1190-1 and an outlet main channel (e.g., the outlet main channel 1196A in FIG. 11A).

FIG. 11G illustrates a cross-sectional area along the line B-B' of the manifold 1126A in FIG. 11A according to an embodiment. For example, the outlet main channel 1196A may have a substantially rectangular cross-sectional area.

FIGS. 11H and 11I illustrate cross-sectional areas along the line C-C' and line D-D' of the manifold 1126A shown in FIG. 11A, respectively, according to an embodiment. The outlet subchannel 1190A may have a height H in the vertical direction that increases along the second/longitudinal direction, and uses the buoyancy of the vapors generated in the microchannel heat sink under the manifold 1126A to make the vapors move smoothly toward the outlet main channel 1196A and substantially prevent the backflow of vapors. In addition, by preventing the backflow of vapors from the outlet main channel 1196A, the pressure drop in the chip cooling system may be reduced and the pumping power supplied for driving the cooling system may be reduced, thereby reducing energy use and improving cooling efficiency.

Embodiments of the present disclosure relate to a chip cooling apparatus that reduces a thermal resistance of a cooling path. In some embodiments, such a chip cooling apparatus reduces a conduction thermal resistance in the cooling path by one or more of directly bonding a portion (e.g., the microchannel structure 128 in FIG. 1A) of the cooling apparatus to a chip (e.g., the chip 120 in FIG. 1A), reducing one or both of a thickness of a base (e.g., substantially zero thickness as shown in FIG. 4B) of the microchannel structure and a thickness of the chip (e.g., the chip 420B in FIG. 4B), and doping one or both of the base (e.g., the base 422C in FIG. 4C) of the microchannel structure and the chip (e.g., the chip 420C in FIG. 4C). In some embodiments, the chip cooling apparatus reduces a convection thermal resistance in the cooling path by increasing a surface area of the microchannels, or promoting boiling/turbulence of a coolant flow, or both. For example, rough surfaces may be formed as shown in the embodiments of FIGS. 8A to 8E, microchannels each having a relatively high aspect ratio may be formed as shown in the embodiments of FIGS. 9A and 9B, and/or microchannels having different widths and pitches in a stacking direction may be formed as shown in the embodiments of FIGS. 10A and 10B.

Embodiments of the present disclosure also relate to a chip cooling apparatus that controls flow rates of cooling fluid in a plurality of regions where amounts of heat to be dissipated are different. In some embodiments, such a chip cooling apparatus may include two or more zones such that flow rates through the zones are controlled independently according to power densities of heat generated from regions of the chip in the zones.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. A cooling apparatus comprising:

a microchannel structure including a plurality of microchannels, a base over which the plurality of microchannels are disposed, and a plurality of fins spaced apart from each other and disposed over the base; and a manifold disposed over the plurality of microchannels, wherein the microchannel structure is directly bonded to a chip and configured to dissipate heat generated in the chip during an operation of the chip, wherein a portion of the chip, or one or more of the fins, or both include one or more impurity elements, wherein the manifold includes:

an inlet main channel extending in a first direction and configured to receive a coolant fluid;

a plurality of inlet subchannels coupled to the inlet main channel and extending in a second direction;

an outlet main channel extending in the first direction and configured to discharge the coolant fluid; and a plurality of outlet subchannels coupled to the outlet main channel and extending in the second direction, wherein each of the inlet subchannels has a first width in the first direction that decreases along the second direction, and each of the outlet subchannels has a second width in the first direction that increases along the second direction, and wherein each of the outlet subchannels has a height in a third direction that increases along the second direction to increase a cross-sectional area through which the coolant flows along the second direction.

2. The apparatus of claim 1, wherein the impurity elements include Boron Arsenide or Boron Phosphorous.

3. A cooling apparatus comprising:

a microchannel structure including a plurality of microchannels, a base over which the plurality of microchannels are disposed, and a plurality of fins spaced apart from each other and disposed over the base; and a manifold disposed over the plurality of microchannels, wherein the microchannel structure is directly bonded to a chip and configured to dissipate heat generated in the chip during an operation of the chip, wherein the plurality of microchannels includes a plurality of first microchannels and a plurality of second microchannels, wherein a first zone includes a first portion of the manifold and the first microchannels, the first zone being disposed over a first region of the chip with first power density generated during the operation of the chip, wherein a second zone includes a second portion of the manifold and the second microchannels, the second zone being disposed over a second region of the chip with second power density generated during the operation of the chip, the second power density being different from the first power density, wherein the apparatus further comprises a flow distribution device configured to control a first flow rate of a coolant in the first zone and a second flow rate of the coolant in the second zone independently based on respective amounts of heat generated in the first and second zones.

4. The apparatus of claim 3, wherein an adjacent pair of the fins and a portion of the base between the adjacent pair define a corresponding one of the plurality of microchannels.

5. The apparatus of claim 4, wherein each of the plurality of microchannels has a rough surface.

6. The apparatus of claim 5, further comprising a plurality of structures, each of the structures being disposed on a sidewall of a corresponding one of the fins and configured to oscillate toward and away from the sidewall.

7. The apparatus of claim 3, wherein the plurality of microchannels includes a plurality of first microchannels completely penetrating a first plate and a plurality of second microchannels partially penetrating a second plate, the first plate being disposed over the second plate.

8. The apparatus of claim 7, wherein the first microchannels have substantially the same width and pitch as those of the second microchannels.

9. The apparatus of claim 7, wherein the first microchannels have width and pitch that are greater than those of the second microchannels.

10. The apparatus of claim 3, wherein the first portion of the manifold includes a first path intersecting the first microchannels and the second portion of the manifold includes a second path intersecting the second microchannels, so as to cause a first portion of the coolant to flow through the first path and cause a second portion of the coolant to flow through the second path flow in parallel with each other.

11. A semiconductor device, comprising:

a chip; and a cooling apparatus configured to dissipate heat generated in the chip during an operation of the chip, the cooling apparatus including a plurality of microchannels, a base over which the plurality of microchannels are disposed, and a plurality of fins spaced apart from each other and disposed over the base, and a manifold disposed over the plurality of microchannels, wherein a portion of the chip, or one or more of the fins, or both include one or more impurity elements, wherein the plurality of microchannels includes a plurality of first microchannels and a plurality of second microchannels, wherein a first zone includes a first portion of the manifold and the first microchannels, the first zone being disposed over a first region of the chip with first power density generated during the operation of the chip, wherein a second zone includes a second portion of the manifold and the second microchannels, the second zone being disposed over a second region of the chip with second power density generated during the operation of the chip, the second power density being different from the first power density, and wherein the cooling apparatus further comprises a flow distribution device configured to control a first flow rate of a coolant in the first zone and a second flow rate of the coolant in the second zone independently based on respective amounts of heat generated in the first and second zones.

12. The device of claim 11, further comprising:

a substrate over which the chip is disposed;

a cover coupled to the substrate to cover the cooling apparatus and the chip; and a plurality of mechanical seals disposed between the cover and the cooling apparatus.

13. The device of claim 12, wherein the manifold has an upper surface on which a plurality of columns are disposed, and the plurality of the mechanical seals are inserted into the plurality of columns, respectively.

* * * * *